United States Patent [19]

Seko

[11] Patent Number: 5,730,634

[45] Date of Patent: Mar. 24, 1998

[54] INSPECTION METHOD AND INSPECTION APPARATUS FOR FIELD-EMISSION COLD CATHODE

[75] Inventor: Nobuya Seko, Tokyo, Japan

[73] Assignee: NEC Corporation, Tokyo, Japan

[21] Appl. No.: 601,566

[22] Filed: Feb. 14, 1996

[30] Foreign Application Priority Data

Feb. 14, 1995 [JP] Japan ................................. 7-025044

[51] Int. Cl.[6] ........................................... H01J 9/42
[52] U.S. Cl. .................................. 445/3; 445/63
[58] Field of Search ................................ 445/3, 63

[56] References Cited

U.S. PATENT DOCUMENTS

| 4,894,611 | 1/1990 | Shimoda et al. ............... 324/158 R |
| 5,591,061 | 1/1997 | Ikeda et al. ...................... 445/3 |

FOREIGN PATENT DOCUMENTS

| 604939 | 7/1994 | European Pat. Off. ............. 445/3 |
| 6-283104 | 10/1994 | Japan .............................. 445/63 |

OTHER PUBLICATIONS

C. A. Spindt, "A Thin–Film Field–Emission Cathode", *J. Applied Physics*, vol. 39, No. 7, Jun. 1968, pp. 3504–3505.

J. Browning, "Experimental Observations of Gated Field Effect Transmitter Failures," 8179 IEEE Electron Device Letters 13 (1992) Mar., No. 3, pp. 167–169.

H. Busta, "Design of High–Vacuum Test Station for Rapid Evaluation of Vacuum Microelectronic Devices," 8093 IEEE Transactions on Electron Devices 38 (1991) Oct., No. 10, pp. 2350–2354.

*Primary Examiner*—P. Austin Bradley
*Assistant Examiner*—Jeffrey T. Knapp
*Attorney, Agent, or Firm*—Sughrue, Mion, Zinn, Macpeak & Seas, PLLC

[57] ABSTRACT

An inspection apparatus including an XY movable table onto which an inspection object wafer is placed in position and a prober for detecting electrons emitted from a field-emission cold cathode of the wafer is provided in a vacuum chamber. A characteristic of the field-emission cold cathode is inspected before it is mounted onto a device.

15 Claims, 6 Drawing Sheets

INSPECTION METHOD AND INSPECTION APPARATUS FOR FIELD-EMISSION COLD CATHODE

BACKGROUND OF THE INVENTION

1. Field of the Invention

This invention relates to an inspection method and an inspection apparatus for a field-emission cold cathode, and more particularly to a method and an apparatus of inspecting the emission characteristic and the insulation characteristic of a field-emission cold cathode while it remains in the form of a wafer during production.

2. Description of the Related Art

In recent years, a field-emission cold cathode has been developed as an electron source as a substitute for a hot cathode, which makes use of thermal emission. The field-emission cold cathode produces a high electric field at the tip of an emitter electrode having a sharp projection to emit electrons into space. Therefore, the sharpness of the tip is a condition which dominates the characteristic of a device, and it is said that the tip of the field-emission cold cathode is required to have a radius of curvature of several hundreds angstroms or less. Further, from the necessity that an opposing electrode must be disposed at a location proximate to the tip of the emitter electrode in order to generate a high electric field, the field-emission cold cathode is usually produced applying a fine processing technique for semiconductor device.

(a) to (d) of FIG. 1 are views showing a field emission cold cathode. (a) of FIG. 1 shows a condition wherein chips 78 each including a large number of very small cold cathodes are formed on wafer 70. (b) of FIG. 1 is a perspective view showing a chip 78 separated from wafer 70. Chip 78 has a size of, for example, approximately 2 mm square. Common gate electrode 73 is provided on the surface of chip 78. Reference numeral 74 denotes a pad for connection of a lead wire for application of a voltage. (c) of FIG. 1 is an enlarged sectional view of the chip shown in (b) of FIG. 1. which formed from a large number of very small cold cathodes 77. (d) of FIG. 1 is a sectional view of one of very small cold cathodes 77.

One of the concrete methods for production of such a field-emission cold cathode as described above has been developed by Spindt et al., the SRI (Stanford Research Institute) in the United States (J. Appl. Phy. 39, 1968, p.3504). Referring to (a) to (d) of FIG. 1, silicon substrate 71 in the form Of wafer 70 is prepared first, and an oxide film is grown on the entire area of wafer 70 to produce insulation layer 72 of 1 µm thick. Then, molybdenum is deposited to the thickness of 0.2 µm by vacuum evaporation to form gate electrode 73. Thereafter, photo-lithography and etching are performed to form openings 75 having a diameter of approximately 1 µm, and to rotate the substrate about an axis perpendicular to its surface, and a sacrifice layer (not shown) of aluminum is deposited at grazing incidence. Then, molybdenum is vacuum evaporated from a vertical direction to deposit emitter electrodes 78. Thereafter, the molybdenum film deposited simultaneously with the deposit of emitter electrodes 76 on the sacrifice layer is removed by lifting off by selective etching of the sacrifice layer. Finally, a chip including a large number of very small cold cathodes is cut away from the wafer to obtain a field-emission cold cathode of a device structure.

The field-emission cold cathode produced in this manner includes a large number of very small cold cathodes as described above. Besides, since a large number of chips are formed on a wafer, it is very difficult to produce the field-emission cold cathodes so that all elements thereof are free from a defect. Therefore, it is required to inspect the emission characteristic and the insulation characteristic to select allowable products. However, for the emission characteristic, inspection has conventionally been performed after each field-emission cold cathode is mounted onto a device such as an electronic tube. Meanwhile, for the insulation characteristic, only a single check is performed with a low voltage in the air. The reason is that, since the field-emission cold cathode is a device which uses the chip surface in vacuum, it is impossible to check its operation and characteristic in the atmospheric air. If a check of the insulation characteristic is performed in the atmospheric air, then adsorbed gas (water vapor) may possibly have an influence on the insulation characteristic or discharge breakdown may possibly occur. Consequently, there is the possibility that a correct element characteristic cannot be evaluated.

As described above, the inspection of the emission characteristic of a field-emission cold cathode is conventionally performed after it is mounted. Further, the inspection of the insulation characteristic conventionally is a simple check which is performed while a low voltage is applied in the atmospheric air. Therefore, the field-emission cold cathode after being mounted exhibits such high leak current that it cannot be used for a practical application, or even if the field-emission cold cathode has a very bad emission characteristic, this can be discriminated only after it is mounted. Accordingly, a device on which a field-emission cold cathode which has a bad characteristic or is of no use is already mounted must be disposed of as a rejected article, resulting in much waste.

Incidentally, production of field-emission cold cathodes is performed in wafer units making use of a process of fine working and thin film formation such as is used for semiconductor devices as described above. In the process for producing semiconductor device, it is a common practice to perform a check of characteristics by means of a prober before a chip is cut away from a wafer. Accordingly, also for a field emission cold cathode, it is desirable to perform inspection of the emission characteristic and the insulation characteristic while it remains in the form of a wafer.

However, even if it is intended to inspect field-emission cold cathodes in wafer unit, contacting a probe pin of a prober with a pad of a gate electrode to perform a measurement matters, since this will cause a disorder in electric field in the space forwardly of the cold cathode and a difficulty in arrangement of collector electrode for collecting electrons emitted from the cold cathodes.

SUMMARY OF THE INVENTION

It is an object of the present invention to provide a method by which, solving the various problems of the prior art described above, an emission characteristic and/or an insulation characteristic of field-emission cold cathodes can be inspected in wafer units and an inspection apparatus for use with the method.

According to an aspect of the present invention, there is provided an inspection apparatus for a field-emission cold cathode, which comprises a vacuum chamber, and an inspection apparatus disposed in the vacuum chamber, and wherein the inspection apparatus includes an XY movable table for moving an inspection object wafer, which has a large number of field-emission cold cathodes, that is, chips, arranged in a matrix thereon, in an X direction and a Y direction, and a prober having a probe pin for applying a voltage to cold cathodes of the chips and a collector electrode for collecting electrons emitted from the cold cathodes. Where the vacuum chamber includes a main vacuum chamber in which an insulation or emission characteristic of the field-emission cold cathodes of the inspection object wafer is inspected, and a sub vacuum chamber in which the inspection object wafer is mounted onto and dismounted from the XY movable table, rapid inspection can be performed. The collector electrode is formed from a cylinder made of a metal and closed at an end thereof. Further, a heater for heating the inspection object wafer is embedded in the inside of the XY movable table onto which the wafer is to be placed in position.

Further, according to the present invention, the inspection object wafer has a plurality of blocks each formed from a plurality of chips and disposed in perpendicular directions in a matrix. A gate electrode of each of the chips which form each of the blocks is led out to an outer peripheral portion of the block. Consequently, an inspection apparatus for a field-emission cold cathode is obtained which includes the prober having a number of probe pins equal to the number of chips which forms the block and the collector electrode which has a size sufficient to cover over the block and has a honeycomb structure or a structure including a plurality of cylinders bundled together.

According to another aspect of the present invention, there is provided an inspection method for a field-emission cold cathode wherein an inspection object wafer is disposed into a vacuum chamber, and a voltage is applied between an emitter electrode and a gate electrode of a field-emission cold cathode of the inspection object wafer while electric current flowing through a collector electrode circuit disposed forwardly of an emitter area of the inspection object wafer is detected.

According to a further aspect of the present invention, there is provided an inspection method for a field-emission cold cathode wherein, for an inspection object wafer in which a plurality of blocks each including a plurality of chips are disposed in perpendicular directions in a matrix, a pad of a gate electrode of each of the chips which forms each of the blocks is led out in advance to an outer peripheral portion of the block, and a probe pin is contacted with the thus led out pad of the gate electrode and a voltage is applied to the pad to inspect an insulation or emission characteristic of the chip. A wire for leading out the gate electrode from each of those chips in the inside of each of the blocks to an outer periphery of the block is disposed in a cut margin for separation of the chips from each other after completion of the inspection, and the leading out wire is removed upon separation. The wire can be removed by applying electricity thereto to melt the wire.

The above and other objects, features, and advantages of the present invention will become apparent from the following description referring to the accompanying drawings which illustrate an example of a preferred embodiment of the present invention.

BRIEF DESCRIPTION OF THE DRAWINGS (a) to (d) of FIG. 1 are schematic views showing field-emission cold cathodes formed on a wafer to be inspected by the prior art;

Figure 4A:
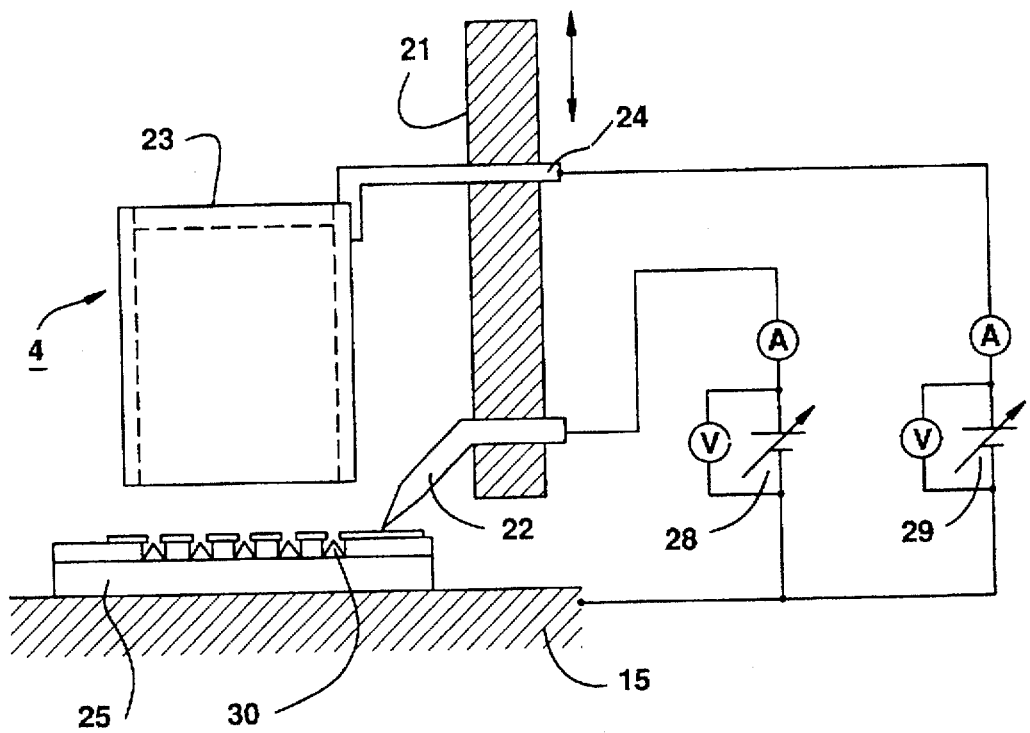
Figure 4B:
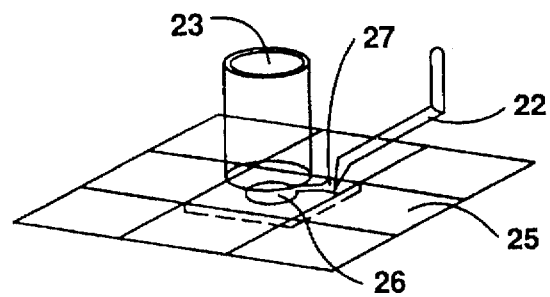
Figure 5:
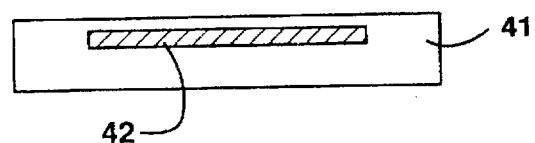
Figure 6A:
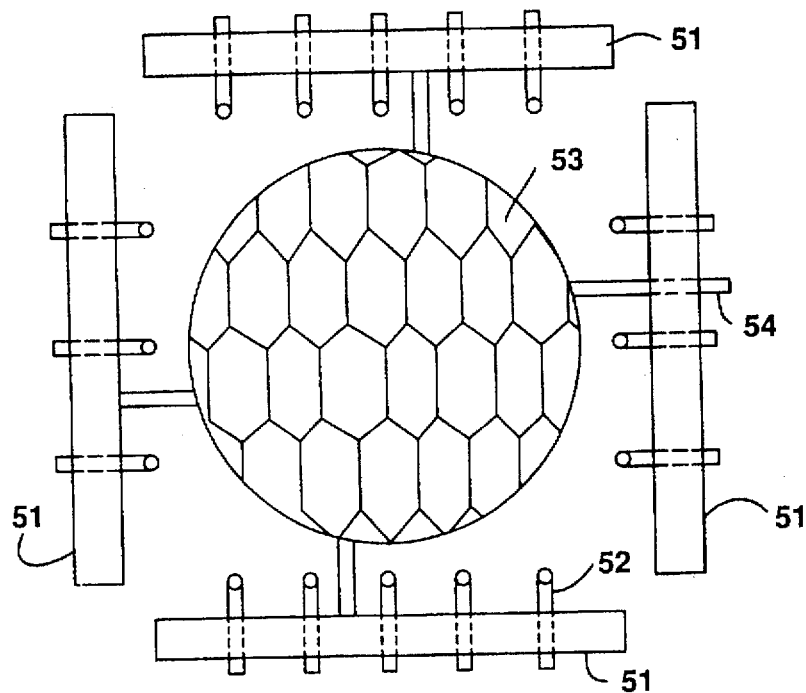
Figure 6B:
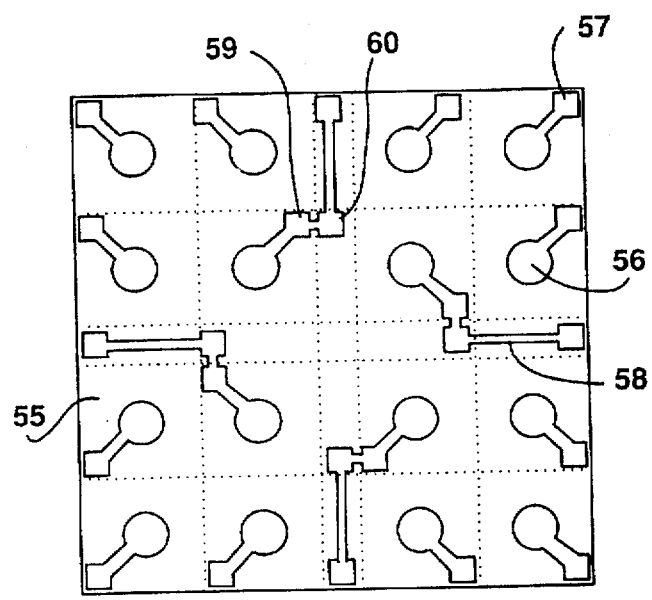
Figure 7:
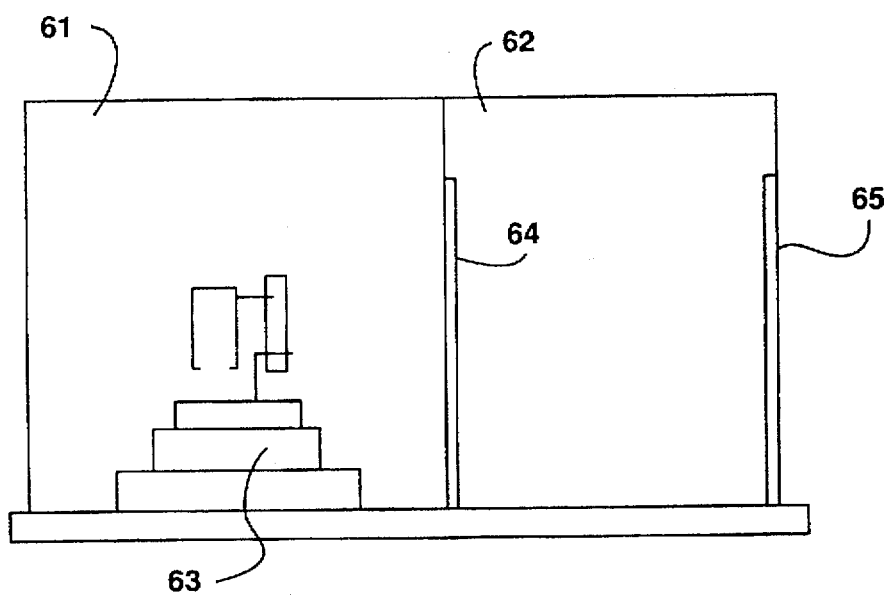

(a) and (b) of FIG. 4 are a schematic diagrammatic view and a partial perspective view, respectively, showing a prober and associated elements in the first embodiment of the present invention;

FIG. 5 is a sectional view of an X movable table in a second embodiment of the present invention;

(a) of FIG. 6 is a horizontal sectional view of a prober and associated elements in a third embodiment of the present invention, and (b) of FIG. 6 is a plan view showing one block of a wafer to be inspected; and FIG. 7 is a sectional view showing a general construction of a fourth embodiment of the present invention.

DETAILED DESCRIPTION OF THE PREFERRED EMBODIMENTS

Figure 1A:
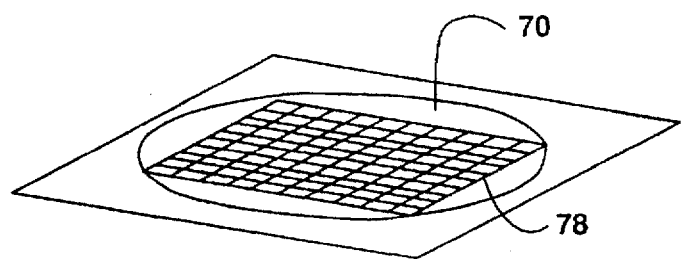
Figure 1B:
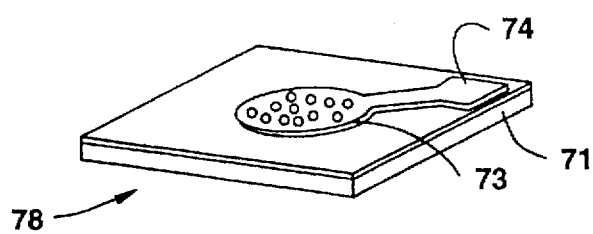
Figure 1C:
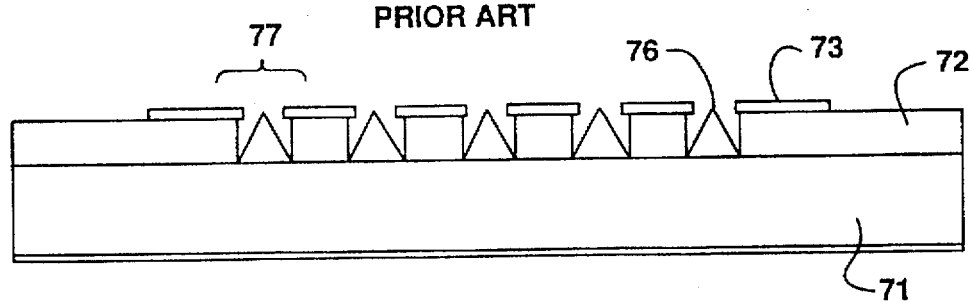
Figure 1D:
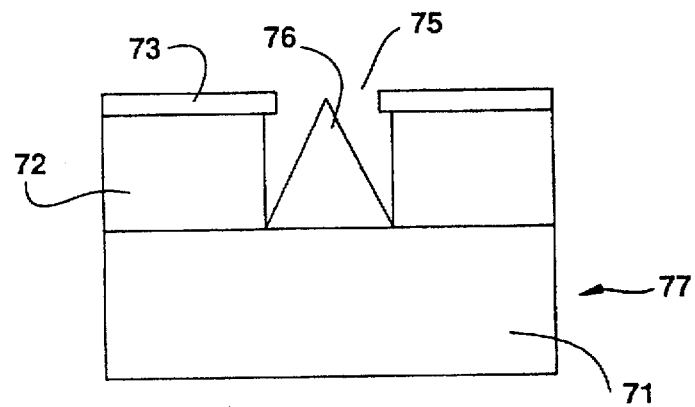
Figure 2:
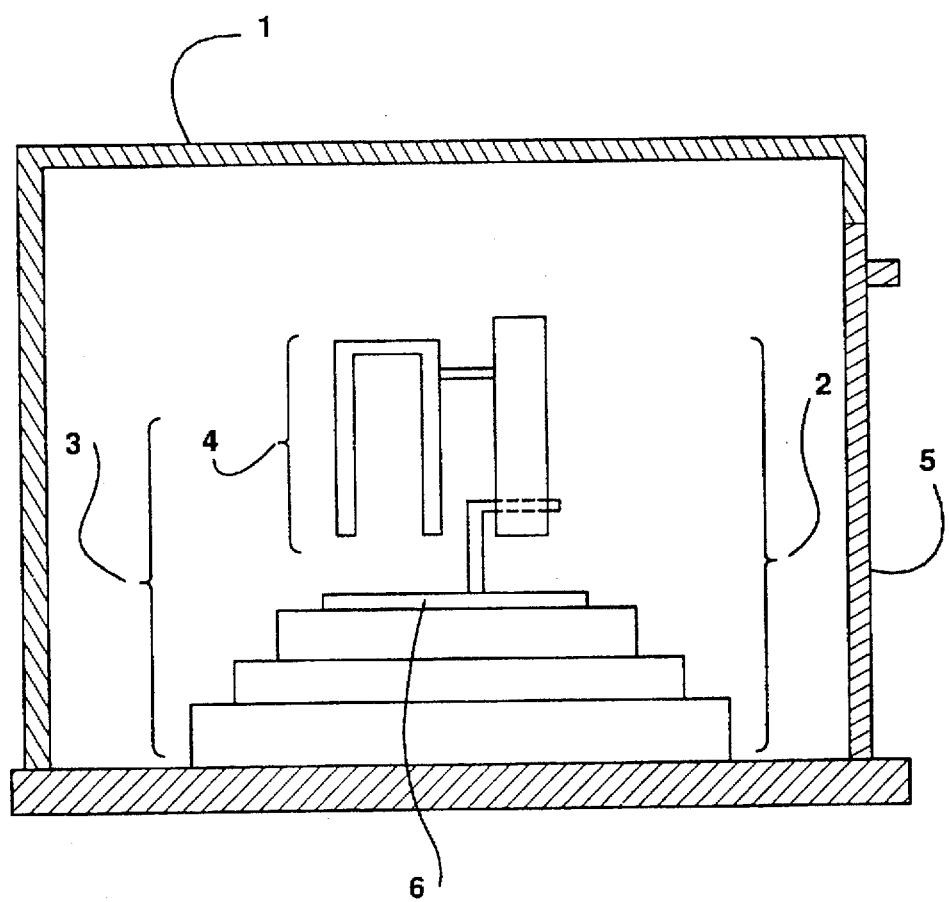
FIG. 2 is a sectional view showing a general construction of a first embodiment of the present invention.

The present invention is described below with reference to the drawings. FIG. 2 is a sectional view schematically showing a first embodiment of an inspection apparatus for a field-emission cold cathode. The inspection apparatus of the present embodiment includes vacuum chamber 1 and inspection apparatus 2 disposed in the inside of vacuum chamber 1. Inspection apparatus 2 is formed from XY movable table 3 for moving a wafer in perpendicular XY directions, and prober 4. Vacuum chamber 1 has door 5 through which wafer 6 can be placed into and removed from vacuum chamber 1. Though not shown, vacuum chamber 1 includes a pump mechanism for removing air from within vacuum chamber 1 to put vacuum chamber 1 into a vacuum condition.

Figure 3:
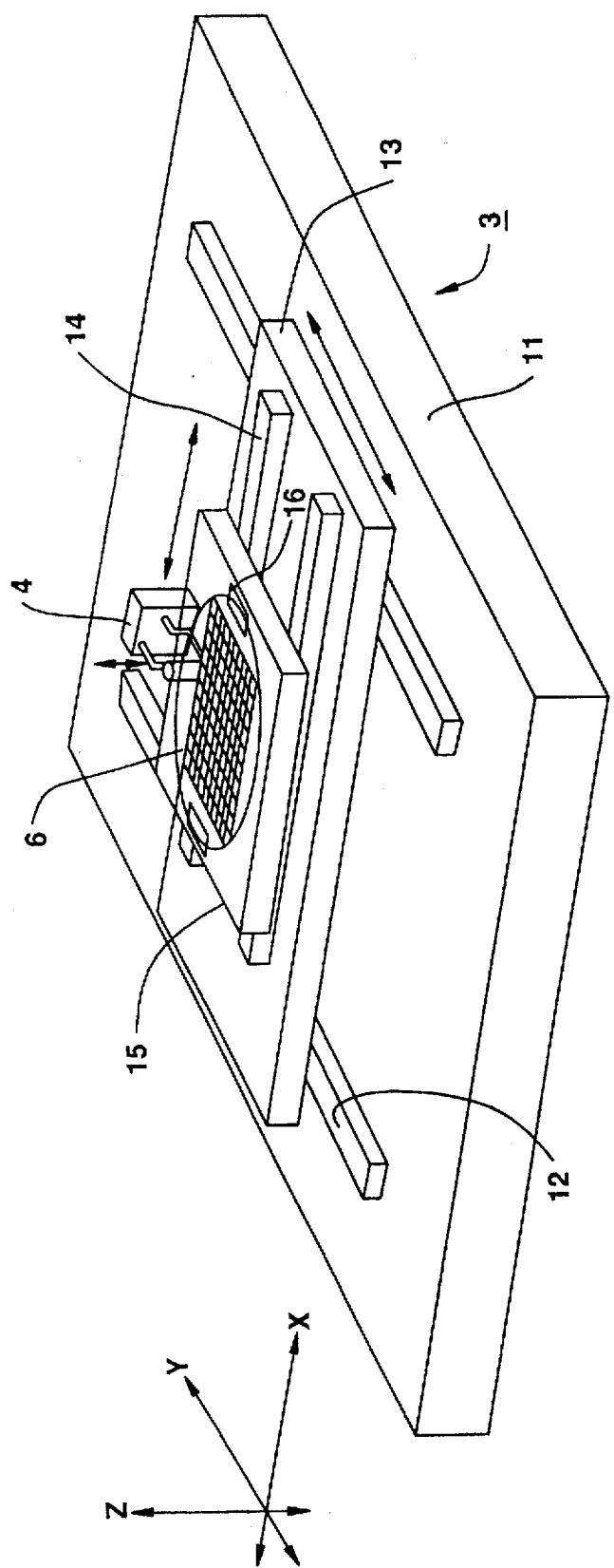
FIG. 3 is a perspective view of an XY movable carriage in the first embodiment of the present invention.

Next, the structure of inspection apparatus 2 will be described. As described above, inspection apparatus 2 includes XY movable table 3 and prober 4. FIG. 3 is a perspective view showing an outline of XY movable table 3. A pair of Y-direction rails 12 are provided on base 11. Y movable table 18 is successively moved by a fixed pitch forwardly or backwardly in the Y direction by a motor or the like under the guidance of Y-direction rails 12. Further, a pair of X-direction rails 14 are provided on Y movable table 13. X movable table 15 is successively moved by a fixed pitch forwardly or backwardly in the X direction by a motor or the like under the guidance of X-direction rails 14. A pair of holding plates 16 for wafer 6 are provided on X movable table 15. Wafer 6 is fixed by holding plates 16 pressed by screws.

Wafer 6 is placed in position between holding plates 16 and X movable table 15. Wafer 6 has been produced by the method of Spindt et al. described hereinabove with reference to (a) to (d) of FIG. 1. For example, from a wafer of 8 inches in diameter, approximately 8,000 chips are produced, and each chip of substantially 2 mm square has approximately 10,000 very small cold cathodes formed in an integrated condition thereon. Gold is plated on the back face of wafer 6 and placed on X movable table 15 made of a metal so that electric connection is established between them.

(a) of FIG. 4 shows a general construction of prober 4. Prober 4 is formed from insulating support 21, probe pin 22 securely mounted on insulating support 21, and collector electrode 23. Collector electrode 23 is secured to insulating support 21 by means of support member 24. Prober 4 is mounted for upward and downward movement. When used to measure the emission characteristic or the insulation characteristic, an operator moves down prober 4 until probe pin 22 is brought into contact with pad 27 of gate electrode 26 as seen from (b) of FIG. 4. A positive voltage of several tens to 100 volts is applied to probe pin 22 from power source 28. Another positive voltage of 300 to 1,000 volts is applied to collector electrode 23 from another power source 29. The negative sides (grounds) of power sources 28 and 29 are connected to X movable table 15. It is to be noted that collector electrode 23 is in the form of a cylinder made of a metal and having a closed end remote from the chip and catches electrons with an inner face of the cylinder.

Next, an inspection method for the emission characteristic and the insulation characteristic of a field emission cold cathode will be described. Wafer 6 having approximately 10,000 very small cold cathodes formed on one chip and having several tens of chips disposed in both of perpendicular XY directions in a matrix is placed in position onto X movable table 15. Prober 4 is moved upwardly and held there, and in this condition, Y movable table 13 and X movable table 15 are moved so that, for example, the left uppermost one of the chips of wafer 6 may be positioned just below prober 4.

Then, prober 4 is moved down until probe pin 22 is brought into contact with pad 27 of gate electrode 26, and a voltage within a predetermined range is applied from power source 28 between gate electrode 26 and X movable table 15, that is, emitter electrode 30. The insulation characteristic can be inspected by checking electric current flowing through the circuit of probe pin 22. When electric current flows, this signifies that the gate electrode and the emitter electrode are short-circuited, and accordingly, the field-emission cold cathode is determined to be a rejected product. Then, a predetermined positive voltage is applied from power source 29 to collector electrode 23. Consequently, electrons which are emitted by field-emission from emitter electrode 30 are caught by collector electrode 23 so that electric current flows through the circuit of collector electrode 23. Since this electric current is initially unstable, time is taken until the electric current is stabilized to a fixed value, that is, aging is performed. Thereafter, the electric current flowing through the circuit of the collector electrode is measured to inspect the emission characteristic while the voltage to be applied to the gate electrode is varied.

After the measurement of the characteristic of the first chip is completed in this manner, prober 4 is moved upwardly, and X movable table 15 is shifted by a distance corresponding to one pitch, for example, in the case of a chip of 2 mm square, by 2 mm, in the X direction so that a next right adjacent chip may be positioned just below prober 4. Then, prober 4 is moved down until probe pin 22 is brought into contact with the pad of the gate electrode, and then aging is performed in a similar manner as described above. Thereafter, the insulation and emission characteristics are inspected. After successive inspections of all of the chips in the first row are completed in this manner, Y movable table 13 is shifted by a distance corresponding to one chip in the Y direction, and the chips in the second row are successively inspected beginning with the leftmost one. Such a sequence of operations is repeated to inspect the insulation and emission characteristics of all of the chips included in the wafer.

As described above, according to the present embodiment, since the emission characteristic and the insulation characteristic of a field-emission cold cathode can be inspected easily and accurately while it remains in the form of a wafer, discrimination of a good product can be performed before it is mounted, which is very economical.

FIG. 5 is a sectional view showing an inspection apparatus of a second embodiment of the present invention. In FIG. 5, only an X movable table of the inspection apparatus is shown, the other components of the inspection apparatus are the same as those of the first embodiment. In the present embodiment, heater 42 for heating a wafer when energized is embedded in the inside of X movable table 41 onto which a wafer is to be placed. A wafer having a field-emission cold cathode formed thereon is exposed to the atmospheric air when it is placed onto an inspection apparatus or in a like case. Thereupon, water vapor or some other gas in the atmospheric air is adsorbed to the surface of the wafer. If the emission or insulation characteristic is measured while such adsorbed gas is left as it is, the gas may have an influence on the measurement and a correct element characteristic may not possibly be evaluated. Therefore, after a wafer is placed in position onto X movable table 41, before a measurement, the wafer is heated by means of heater 42 to remove any gas adsorbed to the wafer, and thereafter, the emission or insulation characteristic of the wafer is inspected.

(a) of FIG. 6 is a view showing an inspection apparatus of a third embodiment of the present invention and is a horizontal sectional view of a prober of the inspection apparatus. The structure of the XY movable table and the other components except the prober is the same as that in the first embodiment. The inspection apparatus of the present embodiment is used to inspect such a chip group including 16 chips as shown in (b) of FIG. 6, that is, a block of 16 chips, at a time. As shown in (a) of FIG. 6, the prober in the present embodiment includes four insulating supports 51 disposed on the front and rear positions and the left and right positions, collector electrode 53 supported to insulating supports 51 by means of support members 54, and probe pins 52 securely mounted on insulating supports 51. A total of 16 probe pins 52 are provided including five probe pins provided on each of the front and rear insulating supports and three probe pins provided on each of the left and right support members. Collector electrode 53 is formed from a large number of tubular members generally having a honeycomb shape and is closed on the side remote from the wafer. Though not shown in (a) of FIG. 6, a power source circuit is connected between probe pins 52 and collector electrode 53. It is to be noted that the prober is disposed in a positional relationship to the XY movable table similar to that illustrated in FIG. 2 of the first embodiment.

(b) of FIG. 6 is a plan view showing a block of 16 chips. Pad 57 of gate electrode 56 of each chip 55 is provided such that it is positioned on the outer periphery side of the block. The gate electrode of each of those chips located in the inside of the wafer is led out to the outer periphery of the block by means of gate leading out wiring pattern 58 provided on a cut margin of the block. This is intended to insure a space in which a collector electrode can be disposed without being disturbed by a probe pin. An actual wafer is formed such that such blocks of chips are arranged by a large number in perpendicular XY directions in a matrix.

Now, an inspection method for the emission characteristic and the insulation characteristic of a field-emission cold cathode of such a wafer structure as described above will be described. The inspection method, however, is substantially the same as that described hereinabove in connection with the first embodiment. First, a wafer is placed in position onto the X movable table and then heated to remove adsorbed gas therefrom. Then, the XY movable table is moved so that the 16-chip block may be positioned below the prober shown in (b) of FIG. 6. The prober is moved down until those of probe pins 52 thereof which correspond to pads 57 of chips 55 disposed adjacent the outer periphery of the chip block are brought into contact with corresponding pads 57. Collector electrode 53 has a size sufficient to cover over the 16-chip block.

A switch is provided for each of electric circuits connected to probe pins 52. Upon inspection of the insulation characteristic, the switches for all of the probe pins are opened once, and then the switches are successively closed one by one for each chip to apply a voltage to successively inspect whether the chip is conducting. Then, prior to an inspection of the emission characteristic, those of the switches for the probe pins which are connected to only those of the chips which have been proved to be acceptable by the inspection of the insulation characteristic are closed, and aging is performed simultaneously for the entire block until electric currents flowing through the collector electrodes become stabilized. Thereafter, all of the switches for the probe pins are opened, and then, similarly as in the inspection of the insulation characteristic, the switches are successively closed one by one for each chip to apply a voltage to successively inspect the emission characteristic. After the inspection of the insulation and emission characteristics of all of the chips of the 16-chip block is completed in this manner, an inspection is repetitively performed in a similar manner for the next block. In this manner, an inspection is performed for all blocks. The wafer for which the inspection has been completed is taken out from the vacuum chamber and separated for each chip to obtain a field-emission cold cathode. It is to be noted that gate leading out wiring patterns 58 disposed on the cut margins are removed upon separation into chips. Or, gate leading out wiring pattern 58 may alternatively be removed by supplying electric current between pads 59 and auxiliary pads 60 of the chips in the inside of each block to melt gate leading out wiring pattern 58 by heat. Consequently, each chip after separation can have an end portion of a gate pattern disposed on the inner side with respect to an outer profile line of the chip, and accordingly, the insulation characteristic between the gate electrode and the emitter electrode is not deteriorated. In this manner, the third embodiment is advantageous in that a plurality of chips can be aged simultaneously.

While, in the description of the present embodiment, inspection is performed for each chip block of 16 chips, the number of chips in one block is not limited to 16, and each block can include a greater number of chips. Where the number of chips in one block is in the maximum, pads of the gate electrodes of all chips can be led out to the outer periphery of the wafer. Further, while the collector electrode having a honeycomb structure is described above, the collector electrode may otherwise have another structure which includes a plurality of cylindrical collector electrodes bundled together.

FIG. 7 is a schematic view showing a fourth embodiment of the present invention. In the embodiments described above, an inspection instrument is disposed in a single vacuum chamber such that placement and removal and inspection of a wafer are performed together. In this instance, each time a wafer is placed in position or removed, the vacuum is lost and the entire inside of the vacuum chamber is exposed to the atmospheric air. If the inner wall of the vacuum chamber is exposed to the atmospheric air, then water vapor or gas in the air is adsorbed to the inner wall of the vacuum chamber, resulting in an increase in time required to evacuate air to put the inside of the vacuum chamber into a vacuum condition. Besides, the adsorbed gas may possibly be evacuated upon inspection of the emission characteristic or the insulation characteristic and have a bad influence on the result of the inspection. In the present embodiment, in addition to main vacuum chamber 61 in which characteristic inspection is to be performed, sub vacuum chamber 62 is provided so that mounting and dismounting of a wafer may be performed in sub vacuum chamber 62. In particular, after inspection comes to an end, door 64 is opened and inspection apparatus 63 is replaced into sub vacuum chamber 62, and then door 64 is closed. Then, the vacuum of sub vacuum chamber 62 is canceled, and door 65 is opened and dismounting and mounting of the wafer is performed, and then sub vacuum chamber 62 is put into a vacuum condition and then inspection apparatus 63 is placed into main vacuum chamber 61. In the present embodiment, since the inside of the main vacuum chamber is not exposed to the atmospheric air, such a bad influence of adsorbed gas as described above can be eliminated. Further, since the time required to evacuate air until a vacuum condition is reached is reduced, the efficiency of the inspection is improved.

In the present invention, since the insulation characteristic or the emission characteristic of a field-emission cold cathode can be inspected while it remains in the form of a wafer before it is mounted onto a device, even if the cold cathode is a rejected product, such a situation that an entire device on which a field-emission cold cathode is mounted must be abandoned is eliminated. Consequently, there is an advantage in that the production cost can be reduced.

Further, in the present invention, whether inspection is performed for each chip or for each block which includes a plurality of chips, since the gate electrode is led out to the outer periphery of the chip or the block and a space is provided forwardly of the emitter area, the collector electrode can be disposed without being disturbed by a probe pin or some other element. Accordingly, there is an advantage in that inspection of the emission characteristic can be performed accurately and easily. Although it is required, where inspection is performed in units of a block including a plurality of chips, to form a pattern for leading out the gate electrode from each of the chips other than those chips located adjacent the outer periphery of the block, also where a stepper, which is utilized frequently for printing of a fine pattern recently, is employed, the present invention can be applied easily by making an inspection block and an exposure unit of the stepper correspond to each other.

It is to be understood that variations and modifications of inspection method and inspection apparatus for a field-emission cold cathode disclosed herein will be evident to those skilled in the art. It is intended that all such modifications and variations be included within the scope of the appended claims.

What is claimed is:

1. A method for inspecting a field-emission cold cathode, comprising the steps of:

disposing an inspection object wafer having a plurality of chips each containing a large number of field-emission cold cathodes arranged in a matrix thereon, into a vacuum chamber, and applying a voltage between an emitter electrode and a gate electrode of a field-emission cold cathode of said inspection object wafer while detecting electric current flowing through a collector electrode circuit disposed forwardly of an emitter area of the inspection object wafer.

2. An inspection apparatus for inspecting an inspection object wafer, having a plurality of chips containing a large number of field-emission cold cathodes arranged in a matrix thereon, comprising:

a vacuum chamber;

an X movable table, disposed in said vacuum chamber, for moving said inspection object wafer in an X direction from one chip of said plurality of chips to another chip of said plurality of chips;

a heater mounted in said X movable table for heating said inspection object wafer embedded inside said X movable table;

a mechanism, disposed in said vacuum chamber, for fixing the inspection object wafer to said X movable table, and a prober, disposed in said vacuum chamber, having at least one probe pin, mounted in said vacuum chamber for upward and downward movement, for applying a voltage to the field emission cold cathodes of the inspection object wafer and a collector electrode for collecting electrons emitted from said cold cathodes.

3. A method for inspecting a field-emission cold cathode of an inspection object wafer having a plurality of blocks each including a plurality of chips disposed in perpendicular directions in a matrix, comprising the steps of:

leading out a pad of a gate electrode of each of said plurality of chips of each of said blocks in advance of an outer peripheral portion of the block;

contacting with a probe pin the thus led out pad of the gate electrode, and applying a voltage to the pad to inspect an insulation or emission characteristic of the chip.

4. An inspection method for a field-emission cold cathode as set forth in claim 3, further comprising disposing a wire for leading out the gate electrode from each of those chips in the inside of each of the blocks to an outer periphery of the block in a cut margin for separation of the chips from each other after completion of the inspection.

5. An inspection method for a field-emission cold cathode as set forth in claim 3, further comprising contacting a wire, leading out the gate electrode from each of said chips inside of each of said blocks to said outer periphery of the block having a plurality of pads, with a probe pin, and removing said wire by applying electricity thereto to melt the wire after completion of the inspection.

6. The method of claim 3, further comprising testing each chip of said plurality of chips to determine whether said chip is conducting and closing switches for each of said probe pins connected to chips of said plurality of chips which have been determined to conduct prior to inspecting an emission characteristic of said chip.

7. An inspection apparatus for inspecting an inspection object wafer, having a plurality of chips each containing a large number of field-emission cold cathodes arranged in a matrix thereon, comprising:

a vacuum chamber;

an XY movable table, disposed in said vacuum chamber, for moving said inspection object wafer in an X direction and a Y direction in increments of distance at least as small as the distance from one chip of said plurality of chips to another chip of said plurality of chips, a mechanism, disposed in said vacuum chamber, for fixing the inspection object wafer to said XY movable table, and a prober, disposed in said vacuum chamber, having at least one probe pin, mounted in said vacuum chamber for upward and downward movement, for applying a voltage to the field emission cold cathodes of the inspection object wafer and a collector electrode for collecting electrons emitted from said cold cathodes.

8. An inspection apparatus for a field-emission cold cathode as set forth in claim 1, characterized in that said vacuum chamber includes a main vacuum chamber for inspecting an insulation or emission characteristic of the field-emission cold cathodes of the inspection object wafer, and a sub vacuum chamber for mounting the inspection object wafer onto and dismounted from said XY movable table.

9. An inspection apparatus for a field-emission cold cathode as set forth in claim 7, characterized in that a heater for heating the inspection object wafer is embedded in the inside of said XY movable table onto which the wafer is to be placed in position.

10. An inspection apparatus for a field-emission cold cathode as set forth in claim 7, characterized in that said collector electrode is a cylinder made of a metal and closed at an end thereof.

11. An inspection apparatus as set forth in claim 1, further comprising a motor coupled to said XY movable table and a pair of rails fitted to said XY movable table for moving said XY table in an X direction.

12. An inspection apparatus as set forth in claim 1, wherein said prober is formed from an insulating support and said probe pin is mounted to said insulating support and said collector electrode.

13. An inspection apparatus as set forth in claim 1 further comprising a first power source for providing of positive voltage to said probe pin and a second positive voltage for providing a positive voltage to said collector electrode.

14. An inspection apparatus for a field-emission cold cathode as set forth in claim 7, characterized in that the inspection object wafer has a plurality of blocks each formed from a plurality of chips and disposed in perpendicular directions in a matrix, that a gate electrode of each of the chips which form each of the blocks is led out to an outer peripheral portion of the block, and that said probe pin of said prober is provided by a number equal to the number of chips which forms the block.

15. An inspection apparatus for a field-emission cold cathode as set forth in claim 14, wherein said collector electrode has a size sufficient to cover over the block and has a honeycomb structure or a structure including a plurality of cylinders bundled together.

* * * * *

UNITED STATES PATENT AND TRADEMARK OFFICE
CERTIFICATE OF CORRECTION

PATENT NO. : 5,730,634
DATED : March 24, 1998
INVENTOR(S) : Nobuya SEKO

It is certified that error(s) appears in the above-identified patent and that said Letters Patent is hereby corrected as shown below:

Col. 1, line 58, change "78" to --76--.

Col. 4, line 36, change "18" to --13--.

Signed and Sealed this

Fifth Day of January, 1999

Attest:

*Attesting Officer*

*Acting Commissioner of Patents and Trademarks*